United States Patent
Bliss et al.

(10) Patent No.: US 7,178,084 B2
(45) Date of Patent: Feb. 13, 2007

(54) SHORT ERROR PROPAGATION MODULATION CODING METHOD AND DEVICE

(75) Inventors: William G. Bliss, Thornton, CO (US); Andrei Vityaev, Soquel, CA (US); Razmik Karabed, San Jose, CA (US)

(73) Assignee: Infineon Technologies AG, Munich (DE)

( * ) Notice: Subject to any disclaimer, the term of this patent is extended or adjusted under 35 U.S.C. 154(b) by 618 days.

(21) Appl. No.: 10/253,916

(22) Filed: Sep. 25, 2002

(65) Prior Publication Data

US 2004/0059980 A1   Mar. 25, 2004

(51) Int. Cl.
    *H03M 13/00* (2006.01)
(52) U.S. Cl. ..................... 714/758; 714/781
(58) Field of Classification Search ............... 714/758, 714/781
    See application file for complete search history.

(56) References Cited

U.S. PATENT DOCUMENTS

| 3,631,471 | A | | 12/1971 | Griffiths |
| 4,051,327 | A | * | 9/1977 | Rigsby ..................... 379/50 |
| 4,989,211 | A | * | 1/1991 | Weng ....................... 714/775 |
| 5,282,215 | A | * | 1/1994 | Hyodo et al. ............. 714/775 |
| 5,528,607 | A | * | 6/1996 | Weng et al. .............. 714/775 |
| 6,084,535 | A | * | 7/2000 | Karabed et al. ........... 341/58 |

FOREIGN PATENT DOCUMENTS

| EP | 0250049 A1 | 12/1987 |
| EP | 0444774 A2 | 9/1991 |
| EP | 0886275 A1 | 12/1998 |

OTHER PUBLICATIONS

Furtney et al., "DC Balanced Encoded Recording", IBM Technical Disclosure Bulletin, vol. 18, No. 1, Jun. 1975.
Bergmans, "Digital Baseband Transmission and Recording", Digital Baseband Transmission and Recording, 1996, pp. 204-207.
Hagenauer, "Rate-Compatible Punctured Convolutional Codes (RCPC Codes) and their Applications", IEEE Transactions on Communications, vol. 36, No. 4, Apr. 1988, pp. 389-400.
Schouhamer, "A Practical Method for Approaching the Channel Capacity of Constrained Channels", IEEE Transactions on Information Theory, vol. 43, No. 5, Sep. 1997, pp. 1389-1399.
Bliss et al., "Sector Error Rate Estimation of Concatenated Codes in Magnetic Recording", Proc., IEEE International Conference on Communications, ICC 2001, Helsinky, Finland, vol. 1 of 10, Jun. 11-14, 2001, pp. 2726-2730.
Feng et al., "On the Performance of Parity Codes in Magnetic Recording Systems", Proc., IEEE Global Telecommunications Conference, San Francisco, CA, Nov. 27, 2000-Dec. 1, 2000, pp. 1877-1881.
Karabed et al., "Constrained Coding for Binary Channels with High Intersymbol Interference", IEEE Transactions on Information Theory, vol. 45, No. 6, Sep. 1999, pp. 1777-1797.

* cited by examiner

*Primary Examiner*—Joseph Torres
*Assistant Examiner*—Mujtaba K. Chaudry
(74) *Attorney, Agent, or Firm*—Staas & Halsey LLP

(57) ABSTRACT

A data coding method produces codewords with a scheme that changes for different codewords, and decodes codewords with a scheme that remains constant for all codewords. The coding method receives k user bits, codes the user bits to produce k+r output bits, corrupts any one of the output bits, and accurately reproduces at least k−r−1 user bits. Codewords coded using the appropriate initial conditions are output. For each codeword, the appropriate initial conditions are appended to the codeword coded therefrom.

12 Claims, 6 Drawing Sheets

Encoder:

$(b0\ b1\ ..\ b63) ==> (c0\ c1\ ..\ c63\ c64) = (b0\ b1\ ..\ b63\ 0)$    if $b0+..+b63>32$, and $(b0\ b1\ ..\ b63) ==> (c0\ c1\ ..\ c63\ c64) = (b0'\ b1'\ ..\ b63'\ 1)$    otherwise.

(For a binary, x, in {0,1}, x' denotes the complement of x.)

FIG. 2A
Related Art

Decoder:

$(g0\ g1\ ..\ g63\ g64) ==> (d0\ d1\ ..\ d63) = (g0\ g1\ ..\ g63)$    if $g64=0$, and $(g0\ g1\ ..\ g63\ g64) ==> (d0\ d1\ ..\ d63) = (g0'\ g1'\ ..\ g63')$    otherwise.

FIG. 2B
Related Art

Encoder: Let S be a map from $\{0,1\}^k$ to $\{0,1\}^r$. Then, the encoder maps user bits, $\underline{b}=(b0\ b1\ ..\ b(k-1))$, into a codeword, $\underline{c}=(c(-r),\ c(-r+1),\ ..,\ c(-1),\ c0,\ c1,\ ..,\ c(k-1))$, where for $0 \leq i \leq k-1$, $c(i)f0 = c(i) = b(i) \oplus c(i-1)f1 \oplus c(i-2)f2 \oplus .. \oplus c(i-r)fr,$ and where $(c(-r),\ ...,\ c(-2),\ c(-1)) = S(\underline{b})$. (Symbol, $\oplus$, denotes mod 2 addition.)

FIG. 3A

Decoder: Decoder maps bits, $\underline{g}=(g0,\ g1,\ ...,\ g(k+r-1))$, to $\underline{d}=(d0\ d1\ ..\ d(k-1))$, where for $0 \leq i \leq k-1$, $d(i) = g(i+r)\ f0 \oplus g(i-1+r)f1 \oplus g(i-2+r)f2 \oplus .. \oplus g(i-r+r)fr.$

FIG. 3B

SHORT ERROR PROPAGATION MODULATION CODING METHOD AND DEVICE

BACKGROUND OF THE INVENTION

FIG. 1 is a schematic representation of a data system such as a magnetic recording medium. In FIG. 1, a sequence of user data is input to an Error Correcting Coder (ECC) 20. An encoder 25 receives k-bit blocks of output b(i) from the ECC 20 and produces m-bit blocks c(i), which are referred to as codewords. The rate of the encoder 25 is thus k/m. The encoder 25 may include an application-specific integrated circuit (ASIC). The encoder 25 outputs the codeword c(i) to a $1/(1 \oplus D^2)$ precoder 30. The ECC 20, the encoder 25, and the precoder 30 receive, encode, and process data in a digital domain. The encoder 25 and the precoder 30 may be combined into one control block capable of encoding and precoding the ECC output b(i), or the precoder may be omitted all together.

The output of the precoder 30, x(i) passes through a channel having one or more filters. FIG. 1 shows a cascade of channel filters 35, 40 denoted by $(1-D^2)$ and $(a+bD+cD^2)$. The output of the filters 35, 40 is corrupted by additive noise, n(i) such that the received sequence r(i) is defined by r(i)=z(i)+n(i). Based on the received sequence r(i), a Viterbi detector 50, for example, generates a detected sequence $\hat{x}(i)$, which is a reproduction of the input x(i) to the channel filters 35, 40. Next, bits $\hat{x}(i)$s are filtered by a filter $(1 \oplus D^2)$ 55, which is an inverse of the precoder 30, to generate g(i). The filter $(1 \oplus D^2)$ 55 may be provided within the detector 50 as one unit. The output g(i) of the filter 55, is decoded by a decoder 60 to produce a decoded sequence d(i), which is a reproduction of the ECC output sequence, b(i). An ECC decoder 65 receives the output sequence d(i).

If $x(i) \neq \hat{x}(i)$, then it is determined that a channel error has occurred at location (time) i. Further, if $b(i) \neq d(i)$, then it is determined that a decoder error has occurred at location (time) i.

In general, in magnetic recording, encoders and decoders perform one or more of the following tasks:

1) enforcing Run Length Limited (RLL) conditions,
2) enhancing system performance (distance), and
3) providing clock recovery information (non-zero samples.)

For task No. 3 mentioned above, there are clocks within the system that must be synchronized. A downstream clock must be expecting a symbol when it is received. Clock drift is a problem associated with the clocks not being synchronized. That is, when a part of the system is expecting a bit to be received, the bit is in the middle of transmission. To accomplish synchronization, a clock looks at the received non-zero symbols and synchronizes its pulses with the receipt of non-zero symbols. Hence, for the purpose of clock recovery, it is beneficial that there be a sufficiently large number of "non-zero"s traveling through the channel.

In generating codewords c(i), the encoder 25 may consider clock recovery. In this case, the encoder 25 produces a sufficiently large number of "1"s for transmission through the channel. FIG. 2A shows an encoder map for an encoder having a rate 64/65 with 64 user bits being received and 65 coded bits c(i) being produced. The encoder map shown in FIG. 2A produces at least 33 "1"s in every 65 bit codeword. To do this, the encoder counts the number of "1"s in every 64 bit sequence of ECC output b(i). If the number of "1"s is more than 32, then the encoder adds a "0" at the end of the block as bit $c_{64}$. Thus, $(c_0, c_1, c_2, \ldots c_{63})=(b_1, b_2, b_3, \ldots b_{64})$.

When the encoder counts the number of "1"s in the 64 bit sequence of ECC output, it is possible that the number of "1"s will be less than or equal to 32. In this case, the 64 incoming bits are changed to the compliment thereof, such that a received "1" is changed to an output "0", and a received "0" is changed to an output "1." To produce the codeword, a "1" is added to the end as bit $c_{64}$ to the 64 bit block $(c_0, c_1, c_2, \ldots c_{63})$.

The decoder takes the opposite action as the encoder. A map for the decoder is shown in FIG. 2B. With this decoder, if $g_{64}$ is a "0", then the decoder outputs bits $g_0$ through $g_{63}$ as bits $d_0$ through $d_{63}$. On the other hand, if $g_{64}$ is a "1", then the decoder outputs the compliment of bits $g_0$ through $g_{63}$ as bits $d_0$ through $d_{63}$.

It should be apparent that bits $c_{64}$ and $g_{64}$ are very important. They determine the output for 64 bits of data. In traveling through the channel, the data can be corrupted. If $g_{64}$ is improperly received at the decoder, a 1 bit error will propagate into a 64 bit error. The operation of the decoder is depended on the map used by the encoder.

SUMMARY OF THE INVENTION

One aspect of the invention relates to reducing error propagation. That is, if a single bit of data is corrupted in the channel or otherwise, it is desired that this single bit of data does not result in a much larger error.

To achieve this and other objects, a data coding method produces codewords with a scheme that changes for different codewords, and decodes codewords with a scheme that remains constant for all codewords. The coding method receives k user bits, codes the user bits to produce k+r output bits, corrupts any one of the output bits, and accurately reproduces at least k−r−1 user bits.

The data coding method may involve (a) coding user data bits $(b_1, b_2, b_3, \ldots, b_k)$ to produce coded bits $(c_1, c_2, c_3, \ldots, c_k)$ according to the following:

$$c_i = b_i \oplus c_{i-1}$$

where $c_i$ and $b_i$ are corresponding user data and coded bits, (b) determining if (a) produces more "1"s when the initial condition $c_0$ is "0" than when the initial condition $c_0$ is "1", (c) producing coded bits $(c_1, c_2, c_3, \ldots c_k)$ using the initial state resulting in the larger number of "1"s, and (d) producing coded bit $c_0$ equal to the initial state resulting in the larger number of "1"s. The user data bits $(b_1, b_2, b_3, \ldots, b_k)$ may be reproduced from coded bits $(c_0, c_1, c_2, \ldots, c_k)$ according to the following:

$$b_i = c_i \oplus c_{i-1}.$$

If an error occurs in bit $c_0$ before reproducing user data bits, at least k−4 user bits, more particularly at least k−3, and still more particularly at least k−2 user bits may be accurately reproduced.

At least one additional bit may be appended to the coded bits $(c_0, c_1, c_2 \ldots c_k)$ to produce $c_0$ to $c_{k+1}$. The at least one additional bit may include a parity bit.

According to a generalized data coding method, an input sequence $(b_0, b_2, b_3, \ldots, b_{k-1})$ is coded to produce a codeword $c=(c(-r), c(-r+1), \ldots, c(-1), c0, c1, \ldots, c(k-1))$, where for $0 \leq i \leq k-1$, according to the following:

$$c(i)f0 = c(i) = b(i) \oplus c(i-1)f1 \oplus c(i-2)f2 \oplus \ldots \oplus c(i-r)fr \qquad \text{II}$$

where $c_i$ and $b_i$ are corresponding user data and codeword bits at time i. For each of a plurality of input sequences, appropriate initial conditions $(c(-r), \ldots, c(-2), c(-1))=S(b)$ are independently selecting to satisfy a predetermined property in the codeword coded according to II. The appropriate initial conditions $(c(-r), \ldots, c(-2), c(-1))$ are thus appended to the codeword symbols (c0, c1, c2, ..., c(k−1)). Codewords coded using the appropriate initial conditions are output. As a first alternative, the following may be used for the generalized data coding method:

k=64,
r=1,
$f_1=1=f_r$, and the predetermined property is producing codewords having more than 32 "1"s.

As a second alternative, the following may be used for the generalized data coding method:

k=64,
r=2,
$f_1=1$,
$f_2=1=f_r$, and the predetermined property is avoiding the following codewords:

w1=(1 1 1 . . . 1 1),
w2=(1 0 1 . . . 1 0), and
w3=(0 1 0 . . . 0 1).

In addition to avoiding the codewords w1, w2, and w3, the predetermined property may also involve producing codewords having more than 22 "1"s.

A pseudo random input vector h may be added mod. 2 to the input sequence before coding the input sequence. The pseudo random input vector h may be defined as follows:

h = (h1 h2 . . . h64) =
(1 0 0 0 0 0 1 0 0 0 0 1 1 0 0 0
1 0 1 0 0 1 1 1 1 0 1 0 0 0 1 1
1 0 0 1 0 0 1 0 1 1 0 1 1 1 0 1
1 0 0 1 1 0 1 0 1 0 1 1 1 1 1 1).

A computer readable medium can store a program to control a computer to perform the above method. A coding device may also have circuits to perform the method.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 2A and 2B show encoder and decoder maps for a related art system;

FIGS. 3A and 3B show encoder and decoder maps, respectively, for one aspect of the present invention;

DETAILED DESCRIPTION OF THE PREFERRED EMBODIMENT

Figure 1:
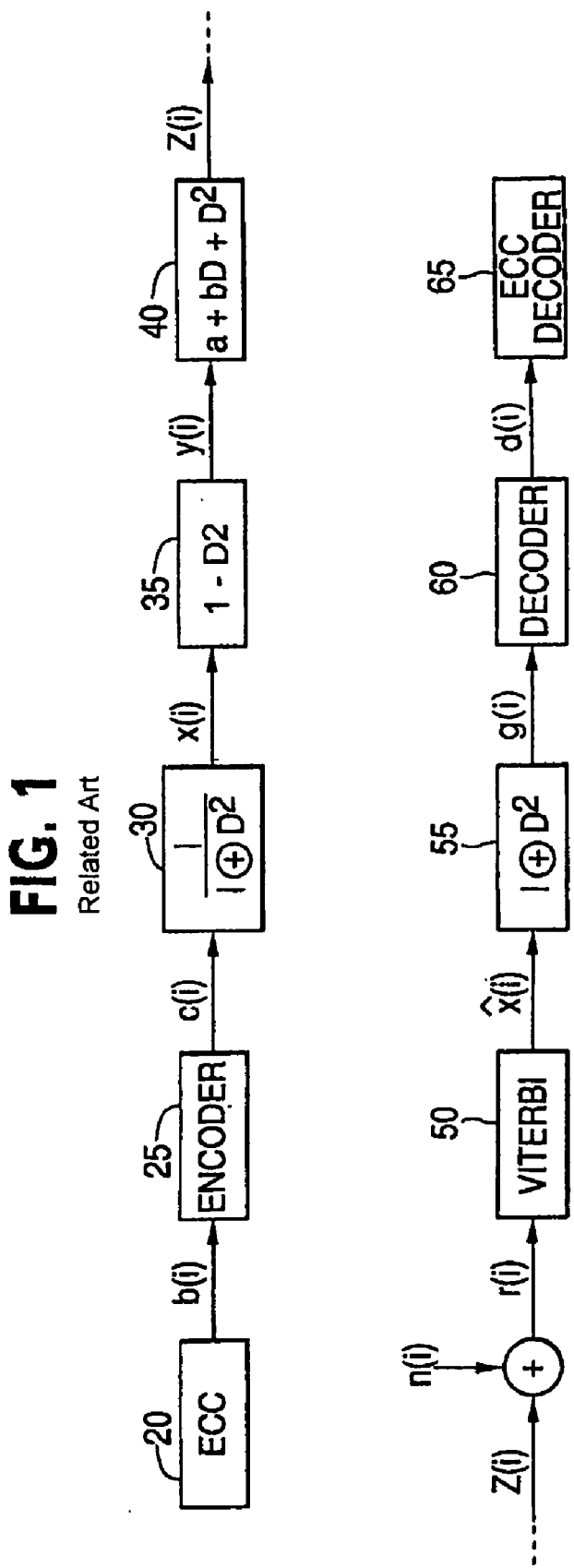
FIG. 1 is a schematic representation of a data system such as a magnetic recording medium.

Reference will now be made in detail to the preferred embodiments of the present invention, examples of which are illustrated in the accompanying drawings, wherein like reference numerals refer to like elements throughout.

Let vector, $f=(f0, f1, \ldots, fr)$, have coordinates in $\{0,1\}$ such that for every i, $0 \leq i \leq r$, fi is 0 or 1. We assume f0=1. If f0=0, then f0 is eliminated from f. Now given a positive integer k, we define a rate k/(k+r) code with the encoder and decoder maps shown respectively in FIGS. 3A and 3B. In FIG. 3A, the phrase where for "$0 \leq i \leq k-1$" means that the formula which follows at line 3 for c(i) is used only for determining c(0), c(1), c(2), ..., c(k−1). In other words, the formula at line 3 is not used for determining c(−r), c(−r+1), ..., c(−1).

Figure 4A:
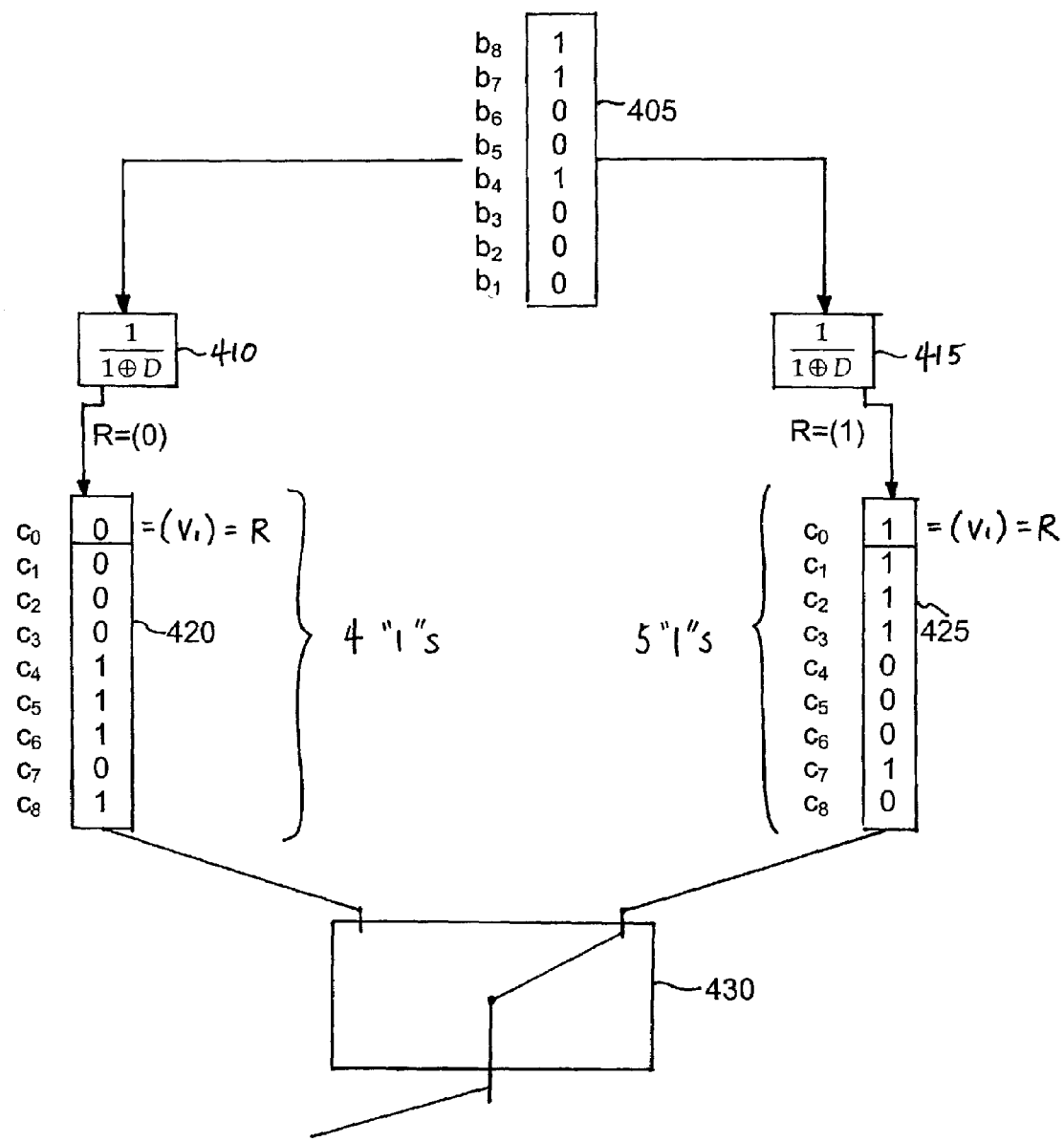
FIGS. 4A and 4B are explanatory diagrams related to the encoder and decoder described in FIGS. 3A and 3B respectively.
Figure 4B:
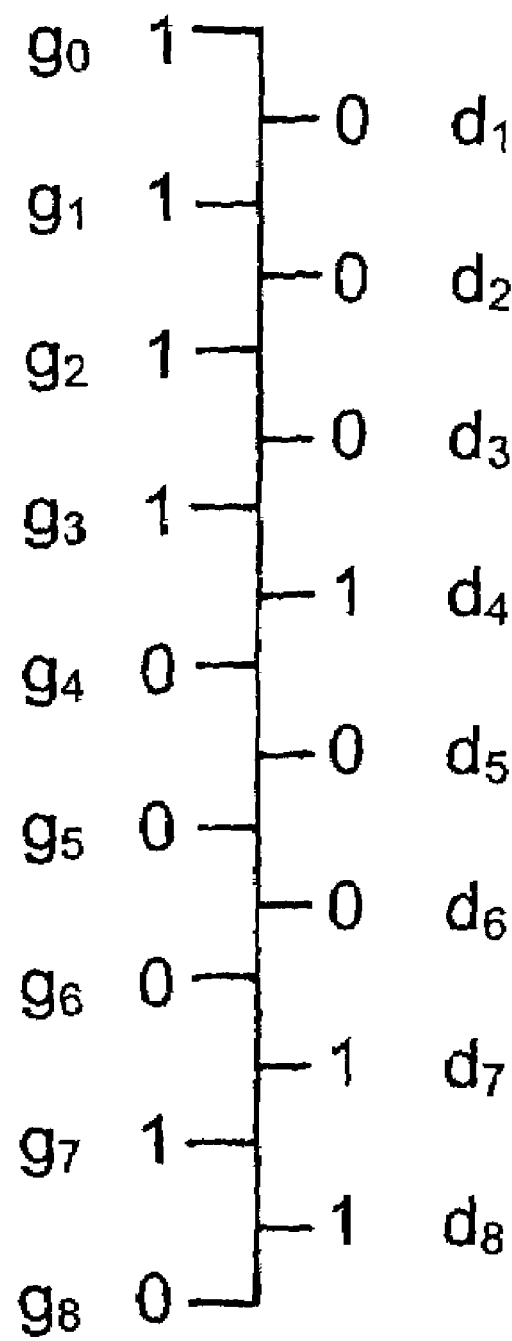

FIGS. 4A and 4B are explanatory diagrams related to the encoder and decoder maps shown in FIGS. 3A and 3B respectively. Although FIG. 4A and 4B do not correspond exactly with any of the embodiments described below, it is believed they are helpful in understanding the general principles of the inventions. In FIG. 4A, reference numeral 405 represents a sequence of data, perhaps output from an error correction coder (ECC). This sequence is then coded according to 1/(1⊕D). Because this coding method performs an exclusive-or function by comparing an incoming data bit with the previously output data bit, it is necessary to specify an initial condition. An initial condition "0" is used for coder 410, and an initial condition of "1" is used for coder 415. Thus, for bit $b_1$, coder 410 performs an exclusive-or function with the initial condition of zero. With two "0"s, the one-and-only-one non-zero element function is not satisfied. Thus, a "0" is output as bit c1 in the data sequence 420. For both the data sequence 420 and the data sequence 425, bits $c_1$ through $c_8$ are determined in this manner. For bit $c_0$, the initial condition is used. Thus, data sequence 420 has a $c_0$ of "0", and data sequence 425 has a $c_0$ of "1".

A comparator 430 compares the number of "1"s in data sequence 420 with the number of "1"s in data sequence 425. Data sequence 425 has 5 "1"s, whereas data sequence 420 only has four "1"s. Comparator 430 selects the data sequence with more "1"s and outputs that data sequence. Thus, for our example, data sequence 425 is output.

A few things should be noted about the example encoder shown in FIG. 4A. First, the rate k/m is 8/9. Second, four "1"s are contained in data sequence 420, and five "1"s are contained in data sequence for 425. It is not a coincidence that the bits contained in the data sequences 420, 425 total 9, the sum of 4 and 5. In determining the number of "1"s produced, aspects of the invention rely upon this feature, as will become apparent later. Third, data stream 420 is the compliment of data stream 425.

FIG. 4B schematically shows what happens in a decoder provided downstream from the encoder shown in FIG. 4A. In FIG. 4B, data sequence $(g_0, g_1, g_2, \ldots, g_8)$ corresponds with data sequence 425 $(c_0, c_1, c_2, \ldots, c_8)$. The function performed in decoder is 1⊕D. Thus, the decoder compares its g0 and g1 in an exclusive-or manner to produce decoded symbol d1. The decoder does not require any initial conditions because it is only comparing decoder inputs. If there is an error in bit $g_4$, for example, that error will propagate to cause errors in bits $d_4$ and $d_5$. However, unlike other methods which ensure a large number of "1"s, no single bit error can corrupt an entire codeword. In the related art example described above, it is crucial that bit $g_8$ be received correctly. This bit determines the entire codeword data sequence. This is not the case for the encoder and decoder shown in FIGS. 4A and 4B, respectively.

Figure 5:
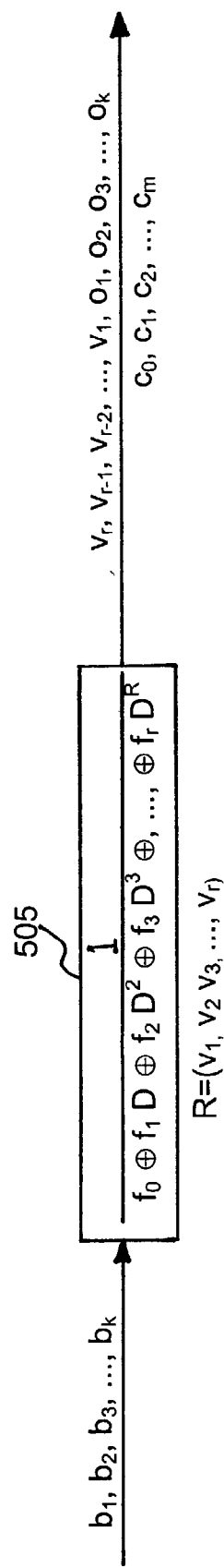
FIG. 5 is a simplified block diagram for the purpose of explaining the encoder map shown in FIG. 3A and the example shown in FIGS. 4A and 4B.

FIG. 5 is a simplified block diagram for the purpose of explaining the encoder map shown in FIG. 3A and the example shown in FIGS. 4A and 4B. In FIG. 5, $b_1$ through $b_k$ are the same as described previously. The filter function in box 505 considers the r previously output symbols. The vector R under the box 505 represents the initial conditions $(v_1, v_2, v_3, \ldots v_r)$. The output from the encoder $(c_0, c_1, c_2, \ldots, c_m)$ is formed by appending the selected initial conditions be $(v_r, v_{r-1}, v_{r-2}, \ldots v_1)$ as shown to the mathematic outputs of box 505 $(o_1, o_2, o_3, \ldots o_k)$. These outputs are produced using the selected initial conditions $(v_1, v_2, v_3, \ldots v_r)$. For the example shown in FIGS. 4A and 4B, k=8, m=8, f=(f0, f1)=(1,1), R=($v_1$), and $v_1$ is selected as shown in FIG. 4A to be "1".

The following are the properties associated with the general encoding and decoding scheme described above. First, the encoder and decoder above are completely characterized by vector f and map S. If the vector f and the map S are known, any sequence can be coded. Therefore, we sometimes represent the encoder and decoder respectively using notations, E(f, S) and D(f, S). These notations emphasize the underlying structure of the encoder and the decoder.

Second, despite what is stated above, the decoder is actually independent of map S. However, this is not true for the encoder. For every pair of distinct maps, S' and S", in general, E(f, S') is not the same as E(f, S").

Third, if r is small, then the above encoder and decoder pair will have short error propagation. From the decoder description above, each channel error $(c(i) \neq g(i))$ can cause at most r+1 decoder errors.

Fourth, let R0, R1, . . . , Rr be the following initial state vectors $(v_1, v_2, v_3, \ldots, v_r)$ used to map from $\{0,1\}^k$ to $\{0,1\}^r$. For every, b in $\{0,1\}^k$, R0(b)=(0 0 . . . 0)
R1(b)=(1 0 . . . 0)
R2(b)=(0 1 . . . 0)
. . .
Rr(b)=(0 0 . . . 1)

Now given a map, S, and a vector, b in $\{0,1\}^k$, we have $$E(f, S)(b) = E(f, R0)(b) \oplus v_1 * E(f, R1)(0) \oplus v_2 * E(f, R2)(0) \oplus \ldots v_r E(f, Rr)(0),$$

where 0 represents an all-zero vector having length k in $\{0,1\}^k$ and $(v_1, v_2, v_3, \ldots, v_r)$ is the initial condition vector R selected to produce for the codeword b being considered.

We define a set F to be a collection comprising, E(f, Ri)(0)'s, for $1 \leq i \leq r$. As can be seen from the above, the output is a linear combination of terms. This provides a short cut to determine the output for any input sequence $(b_0, b_2, b_3, \ldots, b_{k-1})$ and any initial condition vector R=$(v_1, v_2, v_3 \ldots, v_r)$. As described above (see FIG. 5, for example), the appropriate initial condition vector may be selected after knowing what would be produced from all possible initial conditions. With the above property, given any input sequence $(b_0, b_2, b_3, \ldots, b_{k-1})$ and any set of initial conditions R=$(v_1, v_2, v_3, \ldots, v_r)$, the output can be calculated by:

1) calculating output for the input sequence $(b_0, b_2, b_3, \ldots, b_{k-1})$ for an all-zero vector of initial conditions R=R0;

2) calculating the output for an all-zero input sequence for each of the non-zero initial condition terms. That is, to determine the output for initial conditions R=(1, 0, 0, 1), the output for an all-zero input sequence vector would be calculated for initial conditions R=(1, 0, 0, 0) and R=(0, 0, 0, 1); and 3) taking the linear combination of the terms produced from items 1) and 2) above according to the equation.

If it were necessary to calculate the output for all possible initial condition vectors $(v_1, v_2, v_3, \ldots v_r)$, this would require $2^r$ calculations for every input sequence $(b_0, b_1, b_2, \ldots, b_{k-1})$. With the above property, all that is necessary is to perform one calculation for the given input sequence and an all-zero initial condition vector and calculate the output for an all-zero input sequence and the initial condition vectors corresponding to the non-zero terms. Thus, instead of performing $2^r$ calculations, only r+1 calculations or fewer are necessary. Further, the outputs for item (2) above do not depend on the input sequence, and thus only need to be calculated once after knowing the length k.

First Embodiment

The first embodiment is analogous to the example illustrated in FIGS. 4A and 4B, and has the following properties:

1) k=64 In the example shown in FIGS. 4A and 4B, k=8, 2) f1=(1, 1), (r=1) The notation f1 indicates that this is the f vector for the first embodiment. With the f vector f1=(1,1), the encoder uses the formula 1/(1⊕d). r=1 indicates that only one initial condition is necessary, and this follows from the vector f, and 3) map S1 is defined as follows, $$R(\underline{b}) = 0, \text{ if } E(f1, R0)(\underline{b}) \text{ has more than 32 ones, and}$$
$$= 1, \text{ otherwise.}$$

Now, encoder and decoder, E(f1, S1) & D(f1, S1) have the following properties:

i) Rate=k/(k+r)=64/65 ii) F1={E(f1, R1)(0)}={(1 1 . . . 1)} Thus, if an all-zero input sequence $(b_0, b_1, b_2, \ldots b_{k-1})$ is received and processed with R=($v_1$)=R1=(0) according to the first embodiment, an all one sequence is produced as the output.

iii) Short Error Propagation—Channel errors influence only two (r+1) consecutive data bits.

iv) For every b in $\{0,1\}^{64}$, the number of ones in c=E(f1, S1)(b) is at least 33. In fact, E(f1, S1) generates the same codewords as the encoder in the related art example. However, in the related art example, a channel error for one symbol could propagate to an error in 64 bits. For the first embodiment, a one bit error can propogate to at the most 2 bits using E(f1,S1).

v) As stated in iv), encoder E(f1, S1) generates at least 33 ones in every codeword. This property is very useful for clock recovery. Previously, it was stated that for the example shown in FIGS. 4A and 4B, one of the possible outputs is the compliment of the other possible output. For the first embodiment, there are only two possibilities for the initial condition vector R, either R=(1) or R=(0). Above property ii) tells us that if the input sequence $(b_0, b_1, b_2, \ldots, b_{k-1})$ is an all-zero vector, and the initial condition vector is defined as R=(1) then the output is an all one vector (1, 1, 1, . . . 1). This is useful in evaluating the linear combination discussed above, which is reproduced below. In the linear combination $$E(f, S)(b) = E(f, R0)(b) \oplus v_1 * E(f, R1)(0) \oplus v_2 * E(f, R2)(0) \oplus \ldots \oplus v_r * E(f, Rr)(0),$$

To find the output produced for a given input vector (b) when $v_1$=0, only the first term on the right side of the equation is used. That is, if $v_1$=0, the output is determined by E(f, R0) (b). On the other hand, if v1=1, the first and second terms are used. The subsequent terms are not present since r=1 and thus $V_1$=$r_1$. The first term is the same as produced from $v_1$=0. The second term produces all one vector according to property ii). Performing mod. 2 addition, the output when $v_1$=1 is the compliment of the output when v1=0.

Second Embodiment

In the second embodiment of the proposed method, we let
1) k=64,
2) f2=(1, 1, 1), (r=2), Thus, we use $1/(1+D+D^2)$ and need two initial conditions.
3) a subset, W={w1, w2, w3}, of $\{0,1\}^{66}$, be defined by
w1=(1 1 1 . . . 1 1),
w2=(1 0 1 . . . 1 1),
w3=(0 1 0 . . . 0 1), and
4) map S2 to be defined as $$S2(\underline{b}) = R0=(0\ 0),\ \text{if}\ E(f2,\ R0)\ (\underline{b})\ \text{is not in}\ W,\ \text{and}$$
$$= R2=(0\ 1),\ \text{otherwise.}$$

Thus, if the output produced for the given input sequence $(b_0, b_2, b_3, \ldots, b_{k-1})$ and the initial condition vector R=(0,0) is not one of w1, w2, w3, then we use R=(0,0)

Encoder and decoder, E(f2, S2) & D(f2, S2) have the following properties:
i) Rate=k/(k+r)=64/66
ii) F2={E(f2, R1)(0), E(f2, R2)(0)}={(1 0 1 1 0 1 . . . 1 0 1(0 1 1 0 1 1 . . . 0 1 1)}

Note that the first two elements in both of the possible outputs are the initial condition vector. Thus, for E(f2, R1), $(c_0, c_1)=(1,0)=R1$. Although R1 is not used as a possible initial condition vector R according to the map for the second embodiment, this is an important property.

iii) Short Error Propagation—Channel errors influence only three (r+1) consecutive data bits.

iv) For every b in $\{0,1\}^{64}$, the codeword c=E(f2, S2)(b) is not in W. This property is true since based on the above description we have
E(f2, S2) (b)=E(f2, R0)(b), if E(f2, R0) (b) not in W, and
E(f2, S2) (b)=E(f2, R0)(b)⊕E(f2, R2)(0)=E(f2, R0) (b)⊕(0 1 1 0 1 1 . . . 0 1 1), otherwise.

In the above two equations for property iv), a few things should be considered referring to the general linear combination discussed previously and reproduced below.

$$E(f,\ S)(b)=E(f,\ R0)(b)\oplus v_1 *E(f,\ R1)(0)\oplus v_2 *E(f,\ R2)(0)\oplus \ldots \oplus v_r *E(f,\ Rr)(0)$$

By definition, we know that if R=$(v_1, v_2)$=(0,0) produces an output which is not in w, then we use R0 for R. If $v_1=v_2=0$, then all terms on the right side of the linear combination disappear except for the first term.

If the initial conditions R=R0=(0,0) produce an output which is in W, then we use the initial conditions R=R2=(0, 1). In this case, $v_1=0$ and $v_2=1$. To find the output at R2, we can use the general linear combination. Because $v_1=0$ and $v_2=1$, the first and third terms remain on the right side of the linear combination. The first term E(f, R0)(b) is known to be one of the w1 through w3. The third term E(f, R2)(0) is known as described in property ii) above. The linear combination of these two vectors produces an output not in W.

Output sequences generated with vectors in set W are not desirable for some channels because they might produce long error events. For these channels, property iv) contributes to limiting the length of the error events.

Third Embodiment

The third embodiment is similar to the second embodiment. List 1)–5) below describes the third embodiment.
1) k=64,
2) f3=f2=(1,1,1), (r=2),
3) set, W, is defined as in the second embodiment,
4) let set, N, be a subset of $\{0,1\}^{66}$ comprising all vectors having less than 22 ones, and
5) map S3 is defined by $$S3(\underline{b}) = R0=(0\ 0),\ \text{if}\ E(f3(D),\ R0)\ (\underline{b})\ \text{is not in}\ W \cup N,\ \text{and}$$
$$= R1=(1\ 0),\ \text{otherwise.}$$

Thus, before we select R=R0=(0,0), we confirm that the output thereby produced is not in W and has at least 22 "1"s. Encoder and decoder, E(f3, S3) & D(f3, S3) have the following properties:
i) Rate=k/(k+r)=64/66
ii) F3=F2
iii) Short Error Propagation—Channel errors influence only (r+1) three consecutive data bits.
iv) For every b in $\{0,1\}^{64}$, the codeword c=E(f3, S3)(b) is not in W∪N. This property is true since
E(f3, S3)(b)=E(f3, R0)(b), if E(f3(D), R0)(b) not in W∪N, and
E(f3, S3)(b)=E(f3, R0)(b)⊕E(f3, R0)(0)=E(f3, R0) (b)⊕(1 0 1 1 0 1 . . . 1 0 1), otherwise.

We note that the third embodiment not only satisfies property iv) of the second embodiment but also every codeword generated by encoder, E(f3, S3), has at least 22 ones. Therefore, encoder of the third embodiment, E(f3, S3), contributes more to providing clock recovery information than the encoder of the second embodiment, E(f2, S2).

Forth Embodiment

In many systems, the error performance depends on the user data; some user data on the average performs better than other user data. In general, this dependency is due to 1) the encoder map, 2) the properties of the channel noise, and 3) the properties of the channel filter. Since in the present coding method, there is a strong connection between the structure of a codeword and its corresponding user data, the error performance of a system based on the present method might depend on user data as well.

In such systems where error performance depends on user data, the impact of user data is minimized by modifying the encoder and the decoder as follows. A predetermined pseudo random vector, h, is added to both the data at the input to the encoder and to the output of the decoder. The forth embodiment encoder and decoder, E and D, use the earlier embodiments as follows.

Encoder

First, encoder, E, accepts 64 bits, b. Next it adds (bit-wise mod 2) a constant vector h to b, thereby producing p=b+h. Then, for a fixed i, $1 \le i \le 3$, the encoder applies the map, E(fi, Si), (see previous embodiments) to p, generating codeword c. Thus, after performing mod. 2 addition, one of the first three embodiments is used.

Decoder

Decoder, D, receives m bits, g, then it applies the map, D(fi, Si), (where i defines the map of one of the previous embodiments—the same embodiment as used for the encoder map) to generate vector, q (for i=1, m=65, and for i=2&3, m=66). Finally, the decoder adds the vector h to the vector produced by the map $D(f_i, S_i)$ to produce bits, d.

In one example, the vector h may be defined as follows:

$$\underline{h} = (h1\ h2\ \ldots\ h64) =$$
$$(1\ 0\ 0\ 0\ 0\ 0\ 1\ 0\ 0\ 0\ 0\ 1\ 1\ 0\ 0\ 0$$

-continued

```
1 0 1 0 0 1 1 1 1 0 1 0 0 0 1 1
1 0 0 1 0 0 1 0 1 1 0 1 1 1 0 1
1 0 0 1 1 0 1 0 1 0 1 1 1 1 1 1).
```

In addition to adding the vector h, encoders and decoders designed based on the present method can be modified as follows. Additional bits can be added to each codeword to force properties such as:
1) Parity structures in codewords, or
2) Parity structures at the output of a precoder in recording systems that use a precoder between the encoder and the channel.

These modified encoders and decoders contribute to enhancing system performance (distance). The additional bits can be added to the sequence either before or after the encoder. Of course, if the additional bits are added after the encoder, then they would need to be removed before the decoder. Where the additional bits are added (before or after the encoder), depends on whether the encoding and decoding method will corrupt the additional bits. For example, a parity bit considers the number of "1"s in the codeword after the precoder. The number of "1"s and hence the parity bit cannot be determined until after the codeword is produced. Thus, the parity bit should be added after the encoder and removed before the decoder.

The system implementing the method described above includes permanent or removable storage, such as an application specific integrated circuit (ASIC), magnetic and optical discs, RAM, ROM, etc. on which the process and data structures of the present invention can be stored and distributed. Also, the system implementing the method described above applies not only to magnetic recording, but so to various other communication systems. The processes can also be distributed via, for example, downloading over a network such as the Internet.

The invention has been described in detail with particular reference to preferred embodiments thereof and examples, but it will be understood that variations and modifications can be effected within the spirit and scope of the invention.

What is claimed is:

1. A data coding method comprising:
   (a) coding an input sequence $(b_0, b_1, b_2, \ldots, b_{k-1})$ to produce a codeword $c=(c(-r), c(-r+1), \ldots, c(-1), c(0), c(1), \ldots, c(k-1))$, where for $0 \leq i \leq k-1$, $c(i)$ is determined according to the following:

$c(i)f0=c(i)=b(i) \oplus c(i-1)f_1 \oplus c(i-2)f_2 \oplus \ldots \oplus c(i-r)f_r$ where $c_i$ and $b_i$ are corresponding user data and codeword bits at time i;
   (b) for each of a plurality of input sequences, independently selecting appropriate initial conditions $(c(-r), c(-r-1), \ldots, c(-2), c(-1))$ to satisfy a predetermined property in the codeword coded according to (a); and
   (c) outputting codewords coded using the appropriate initial conditions;
   wherein:
   k=64,
   r=1 or 2, and,
   $f_2=1=f_r$.

2. A data coding method according to claim 1, wherein: the predetermined property is producing codewords having more than 32 "1"s.

3. A data coding method according to claim 2, wherein a pseudo random input vector h is added mod. 2 to the input sequence before coding the input sequence.

4. A data coding method according to claim 3, wherein the pseudo random input vector h is defined as follows:

```
h = (h1 h2 ... h64) =
(1 0 0 0 0 0 1 0 0 0 0 1 1 0 0 0
 1 0 1 0 0 1 1 1 1 0 1 0 0 0 1 1
 1 0 0 1 0 0 1 0 1 1 0 1 1 1 0 1
 1 0 0 1 1 0 1 0 1 0 1 1 1 1 1 1).
```

5. A data coding method according to claim 1, wherein:
   $f_1=1$, and,
   the predetermined property is avoiding the following codewords:
   w1=(1 1 1 . . . 1 1),
   w2=(1 0 1 . . . 1 0), and
   w3=(0 1 0 . . . 0 1).

6. A data coding method according to claim 5, wherein a pseudo random input vector h is added mod. 2 to the input sequence before coding the input sequence.

7. A data coding method according to claim 6, wherein the pseudo random input vector h is defined as follows:

```
h = (h1 h2 ... h64) =
(1 0 0 0 0 0 1 0 0 0 0 1 1 0 0 0
 1 0 1 0 0 1 1 1 1 0 1 0 0 0 1 1
 1 0 0 1 0 0 1 0 1 1 0 1 1 1 0 1
 1 0 0 1 1 0 1 0 1 0 1 1 1 1 1 1).
```

8. A data coding method according to claim 5, wherein the initial conditions $(c(-2), c(-1))$:
   are selected to be (0, 0) if the codeword is not one of the codewords w1, w2, and w3, and
   are selected to be (0, 1) otherwise.

9. A data coding method according to claim 1, wherein:
   $f_1=1$, and
   the predetermined property is producing codewords having more than 22 "1"s and avoiding the following codewords:
   w1=(1 1 1 . . . 1 1),
   w2=(1 0 1 . . . 1 0), and
   w3=(0 1 0 . . . 0 1).

10. A data coding method according to claim 9, wherein a pseudo random input vector h is added mod. 2 to the input sequence before coding the input sequence.

11. A data coding method according to claim 10, wherein the pseudo random input vector h is defined as follows:

```
h = (h1 h2 ... h64) =
(1 0 0 0 0 0 1 0 0 0 0 1 1 0 0 0
 1 0 1 0 0 1 1 1 1 0 1 0 0 0 1 1
 1 0 0 1 0 0 1 0 1 1 0 1 1 1 0 1
 1 0 0 1 1 0 1 0 1 0 1 1 1 1 1 1).
```

12. A data coding method according to claim 9, wherein the initial conditions $(c(-2), c(-1))$:
   are selected to be (0, 0) if the codeword is not one of the codeword w1, w2 and w3 and if the codeword has at least 22 "1"s, and
   are selected to be (1, 0) otherwise.

* * * * *

UNITED STATES PATENT AND TRADEMARK OFFICE
CERTIFICATE OF CORRECTION

PATENT NO. : 7,178,084 B2 Page 1 of 1
APPLICATION NO. : 10/253916
DATED : February 13, 2007
INVENTOR(S) : William G. Bliss et al.

It is certified that error appears in the above-identified patent and that said Letters Patent is hereby corrected as shown below:

Column 9, Line 54, claim 1, change "c(-r-1)," to --c(-r+1),--.

Column 10, Line 12, claim 5, change "and," to --and--.

Signed and Sealed this

Fourth Day of March, 2008

JON W. DUDAS
*Director of the United States Patent and Trademark Office*